(12) United States Patent
Lee et al.

(10) Patent No.: US 6,583,495 B2
(45) Date of Patent: Jun. 24, 2003

(54) VARIABLE CAPACITOR AND MEMORY DEVICE EMPLOYING THE SAME

(75) Inventors: Chul-woo Lee, Sungnam (KR); Seung-tae Jung, Sungnam (KR); Hee-wan Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/964,510

(22) Filed: Sep. 28, 2001

(65) Prior Publication Data

US 2002/0041513 A1 Apr. 11, 2002

(30) Foreign Application Priority Data

Oct. 11, 2000 (KR) .................................. 10-2000-59649

(51) Int. Cl.[7] .............................................. H01L 29/93
(52) U.S. Cl. ...................... 257/595; 257/600; 257/312
(58) Field of Search ................................ 257/595, 600, 257/312; 365/117, 145, 157

(56) References Cited

U.S. PATENT DOCUMENTS

| | | | | |
|---|---|---|---|---|
| 3,646,413 A | * | 2/1972 | Oomen ........................ 361/281 |
| 4,122,550 A | * | 10/1978 | Caywood ..................... 365/222 |
| 4,816,894 A | * | 3/1989 | Hattori ........................ 257/532 |
| 5,075,600 A | * | 12/1991 | El-Hamamsy et al. ...... 315/248 |
| 6,072,454 A | * | 6/2000 | Nakai et al. ................. 345/997 |
| 6,096,127 A | * | 8/2000 | Dimos et al. ................. 117/9 |
| 6,110,791 A | * | 8/2000 | Kalnitsky et al. ........... 438/379 |

* cited by examiner

Primary Examiner—David Nelms
Assistant Examiner—Tu-Tu Ho
(74) Attorney, Agent, or Firm—Staas & Halsey LLP

(57) ABSTRACT

A variable capacitor and a memory device employing the same. The variable capacitor includes a first electrode formed above a substrate; a second electrode suspended with respect to the first electrode to be moved back and forth with respect to the first electrode; and an actuator for varying a capacitance. One end of the actuator is connected to the second electrode and mounted with respect to the substrate to move the second electrode with respect to the first electrode in accordance with a voltage signal input through a driving electrode exposed externally. The memory device includes a transistor having a source, a gate, and a drain formed above a substrate, which are spaced apart from each other, a capacitor connected to the source, and an actuator varying a capacitance of the capacitor. With the variable capacitor and the memory device employing the same, the variable capacitor allows the correction of a capacitance error caused during the manufacturing process by varying the capacitance of the capacitor through the electrical driving voltage and provides compatibility in use to be fit to the specification of an electronic unit to which the capacitor is to be applied. The memory device can store multiple values more extensive than binary values in one memory cell, to increase the data storage density thereof.

5 Claims, 4 Drawing Sheets

VARIABLE CAPACITOR AND MEMORY DEVICE EMPLOYING THE SAME

CROSS-REFERENCE TO RELATED APPLICATIONS

This application claims the benefit of Korean Application No. 00-59649, filed Oct. 11, 2000, in the Korean Patent Office, the disclosure of which is incorporated herein by reference.

BACKGROUND OF THE INVENTION

1. Field of the Invention

The present invention relates to a variable capacitor and a memory device employing the same, and more particularly to a variable capacitor capable of varying its capacitance, and a memory device capable of recording multiple values in unit memory cells by using the variable capacitor.

2. Description of the Related Art

Capacitors are circuit devices for storing electric energy, which are almost essentially employed in diverse electric circuits. In general, plural capacitors of varied types are used in an electric circuit.

Such capacitors are mainly classified as fixed capacitors and variable capacitors. Variable capacitors having large capacitances are generally used for mechanically varying the capacitances, which are mainly employed for filter circuits and power supplies.

Only fixed capacitors have been employed in conventional integrated circuits.

In general, integrated circuits manufactured through a semiconductor manufacturing process have respective electric devices reduced into minimized and optimized lithography scales in sizes in order to increase the integration efficiency. In such micro scales, forming highly precise micro patterns without errors on a semiconductor based on the existing lithography and etching processing technologies is extremely difficult. Accordingly, errors occur frequently in the manufacturing process with respect to the capacitances of fixed capacitors. Further, there exists a problem in that follow-up modifications or tuning can not be done with respect to the integrated circuit for apparatuses requiring precise capacitances if errors occur in the capacitances of capacitors manufactured through the semiconductor manufacturing process.

That is, since the integrated devices having lots of integrated electronic devices include capacitors formed therein of which capacitances can not be varied according to necessity, there exists another problem in that the defects of the integrated devices on the manufacture can not be cured as well as the problem that the integrated devices can not be compatibly used for a specification of an electronic unit.

In the meantime, in case of RAMs and flash memories as examples of the integrated circuits, they are constructed to store data in a binary value by means of one transistor and one capacitor.

Studies are steadily being conducted for increasing the data storage densities of such memory devices.

FIG. 1 is a cross-sectioned view for showing a conventional memory device.

Referring to FIG. 1, a memory device 10 has a transistor 12 formed on a substrate 11 and a capacitor 17. Reference numerals 18a, 18b and 18c indicate insulation layers.

The transistor 12 includes a source (S) 13, a drain (D) 14, and a gate (G) 15 which are spaced apart from each other.

The capacitor 17 is constituted with a first electrode 17a formed to be electrically connected to the source 13 through a conductive connection layer 16, a ferroelectric substance 17b, and a second electrode 17c.

The memory device 10, as shown in the equivalent circuit of FIG. 2, receives write/read signals through the gate 15 connected to a control line 21, and charges the capacitor 17 to a predetermined voltage Vs and discharges a charged voltage through the drain 14 connected to a data line 22, to thereby write and read binary data.

The size of the memory cell should be reduced in order to increase the data storage density in such a conventional memory device. By the way, the size of the cell determining the data storage density is defined by variables such as a possible minimum pattern size (F) by the lithography, a clearance area (f) necessary for arrangements between cells, a minimum switching electric charge quantity Qswo, and the like.

In case of a DRAM as an example, the following relationship is obtained among a capacitance Co of the capacitor 17, a cell driving voltage Vdd, a switching electric charge quantity Qswo, and an area Ao($\mu m^2$) of the capacitor 17.

$$Co \times 10^{-15} \times Vdd = Qswo \times Ao \times 10^{14} \quad \text{\{Formula 1\}}$$

The following Formula 2 is obtained from rewriting Formula 1.

$$Qswo = Co \times Vdd / 10 \times Ao \quad \text{\{Formula 2\}}$$

Where, in case that Co=30fF and Vdd=3V are applied with respect to the respective variables, Qswo=9/Ao is obtained. Further, in case that a dielectric substance used for the capacitor 17 is a ferroelectric substance having the QSW of about 20 $\mu C/cm^2$, the area Ao of the capacitor 17 requires an area of about 0.23 $\mu m^2$. That is, it is difficult to form one side of the capacitor 17 less than 0.47 $\mu m$.

Accordingly, the memory device 10 using the conventional fixed capacitor 17 has some restrictions in increasing the data storage density since difficulties exist in reducing the area of a unit cell storing data in a binary scale to an area less than a certain size.

SUMMARY OF THE INVENTION

The present invention is devised to solve the problems stated above, and it is an object of the present invention to provide a variable capacitor which can be manufactured by using semiconductor micro machining technologies and of which capacitance can be varied according to necessity.

It is another object of the present invention to provide a memory device in which data per cell can be stored in multiple values by applying the variable capacitor.

Additional objects and advantages of the invention will be set forth in part in the description which follows, and, in part, will be obvious from the description, or may be learned by practice of the invention.

In order to achieve the above and other objects, the variable capacitor comprises a first electrode formed above a substrate; a second electrode installed to be able to float with respect to the first electrode and movable back and forth with respect to the first electrode; and a device to vary a capacitance, one end of which is connected to the second electrode and mounted with respect to the substrate to move the second electrode with respect to the first electrode in accordance with a voltage signal input through a driving electrode exposed externally.

Preferably, the device to vary the capacitance comprises a piezoelectric device contracted and expanded in response to a voltage input through the driving electrode.

Further, the variable capacitor comprises first and second electrodes formed at a distance spaced apart from each other above a substrate; a dielectric substance installed to move back and forth in a space between the first and second electrodes; and a device connected to the dielectric substance and formed above the substrate to move the dielectric substance back and forth in accordance with a voltage input through a driving electrode exposed externally, to vary a capacitance.

In order to achieve the above and other objects as stated above, the memory device according to the present invention comprises a transistor having a source, a gate, and a drain formed above a substrate, which are spaced apart from each other; and a variable capacitor connected to the source and having a device varying a capacitance of the capacitor. Note that any type of transistor may be used in the alternative including or having an emitter, collector, and a drain.

Preferably, the capacitor includes a first electrode formed above the substrate to be electrically connected to the source; and a second electrode formed to have a distance with respect to the first electrode which can be varied by the device to vary the capacitance.

The device to vary the capacitance includes a driving electrode extended externally; and an actuator mounted with respect to the dielectric substance, spaced apart by a predetermined distance along a direction opposite to the first electrode, and moving the second electrode back and forth in response to a signal input through the driving electrode, one end opposite to the first electrode being connected to the second electrode.

Further, the capacitor includes a first electrode formed on the substrate to be electrically connected to the source; a second electrode formed on the substrate to be spaced apart a distance from the first electrode; and a dielectric substance installed to move back and forth in a space between the first electrode and the second electrode, the device to vary the capacitance being formed above the substrate to move the dielectric substance back and forth.

BRIEF DESCRIPTION OF THE DRAWINGS

The above objects and other advantages of the present invention will become more apparent by describing in detail a preferred embodiment thereof with reference to the attached drawings, in which.

DETAILED DESCRIPTION OF THE PREFERRED EMBODIMENTS

Figure 1:
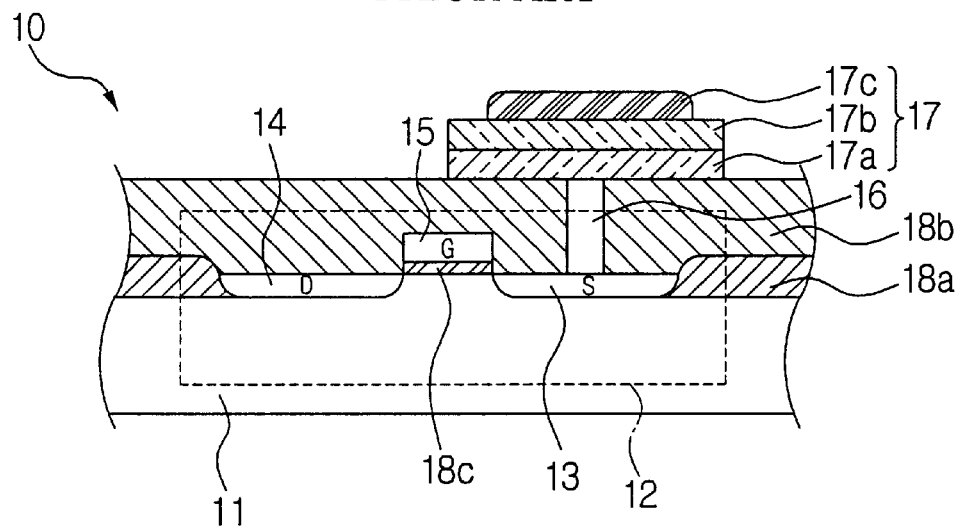
FIG. 1 is a cross-sectional view for showing a conventional memory device.
Figure 2:
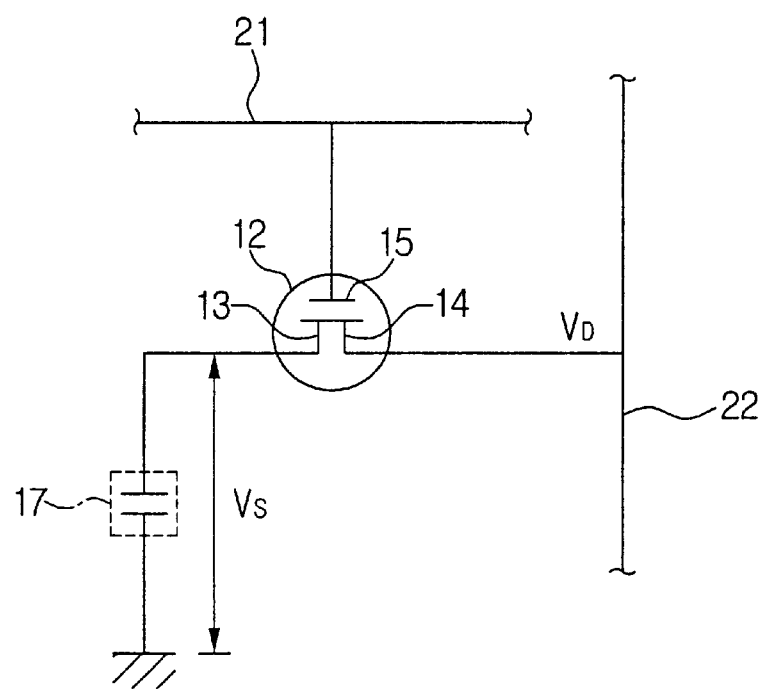
FIG. 2 is a view for showing an equivalent circuit for explaining the driving of the memory device of FIG. 1.

Reference will now be made in detail to preferred embodiments of the present invention, examples of which are illustrated in the accompanying drawings, wherein like reference numerals refer to like elements throughout.

Figure 3:
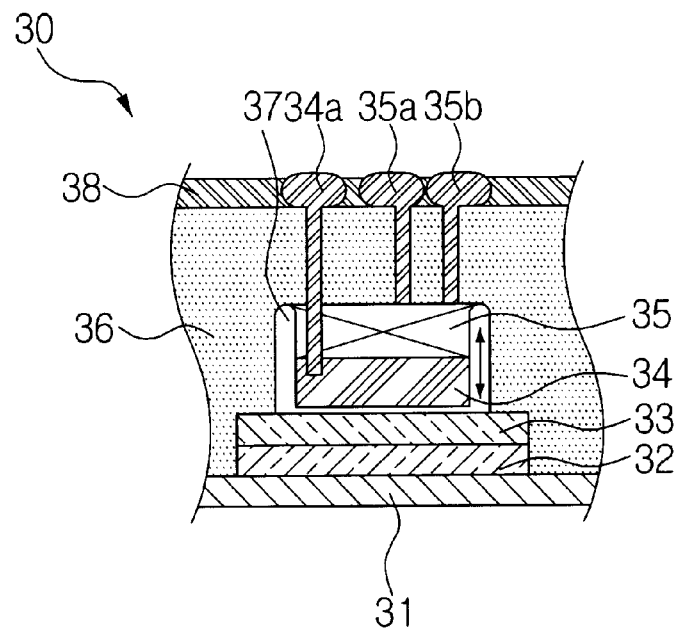
FIG. 3 is a cross-sectional view showing a variable capacitor according to a first embodiment of the present invention.

FIG. 3 is a cross-sectional view showing a variable capacitor according to a first embodiment of the present invention.

Referring to FIG. 3, a variable capacitor 30 has a first electrode 32 formed above a substrate 31, a dielectric substance 33, a second electrode 34, and an actuator 35. The dielectric substance may be formed of a ferroelectric material. A reference numeral 36 is a support layer supporting the actuator 35 to float with respect to the first electrode 32, and a reference numeral 38 is an insulation layer.

The substrate 31 may be manufactured from a silicon material generally employed in the semiconductor manufacturing process.

The first electrode 32 may be formed of conductive materials such as platinum Pt, Iridium Ir, Ruthenium Ru, Rhodium Rh, and Palladium Pd on the substrate 31, and the dielectric substance 33 may be formed of known ferroelectric materials such as PZT, $Pb(ZrTi)O_2$, and the like of a certain thickness on the first electrode 32.

Space 37 is provided in the support layer 36 formed of an insulation material on the substrate 31 in order for the second electrode 34 to be movable.

The second electrode 34 may be formed of conductive materials such as Platinum Pt, Iridium Ir, Ruthenium Ru, Rhodium Rh, and Palladium Pd, and connected to the actuator 35, to thereby move back and forth with respect to the first electrode 32 in the space 37 inside the support layer 36.

The actuator 35 is an element for varying a capacitance, and mounted to be supported on an upper wall of the space 37 formed in the support layer 36, to thereby move the second electrode 34 up and down according to an electric signal input through driving electrodes 35a and 35b.

There are various methods of forming the integrated circuit as illustrated in FIG. 3, including such methods as deposition, etching and liftoff to form the respective component parts. One example, although not limiting, may be as follows. First, an elimination layer, the electrode 34, and the actuator 35 are formed on a ferroelectric substance 33, with an open space defined therein. An insulating layer is also formed such that the actuator 35 is supported with respect to the substrate 31. Then, through the open space, the eliminating layer is eliminated by etching. The rest of the components may then be formed successively. In order to close the opened space, the upper portion may be closed over by such methods as deposition.

Preferably, the actuator 35 is formed of a piezoelectric material contractable and expandable according to an applied voltage. In this case, the actuator 35 is contracted and expanded according to a signal input through the driving electrodes 35a and 35b, and the second electrode 34 is moved in association with the contraction and expansion of the actuator 35.

A reference numeral 34a is a terminal for the second electrode 34. Although not shown, a terminal for the first electrode 32 can be formed in diverse manners such as in a parallel direction with the first electrode 32, as an extension from the first electrode 32 to be exposed through the upper insulation layer 38, or the like. That is, the terminals for connecting the first electrode 32 and the second electrode 34 to external areas are formed to be fit for the integration of a circuit to be applied thereto.

The variable capacitor 30 varies its capacitance by changing a spaced distance between the first electrode 32 and the second electrode 34.

The variable capacitor 30 is manufactured by forming respective layers with corresponding materials through depositions and lithography processes based on the general semiconductor micro machining technologies. In case of being employed in an integrated device, the variable capacitor 30 is formed to be fit for a circuit which is applied thereto.

Figure 4:
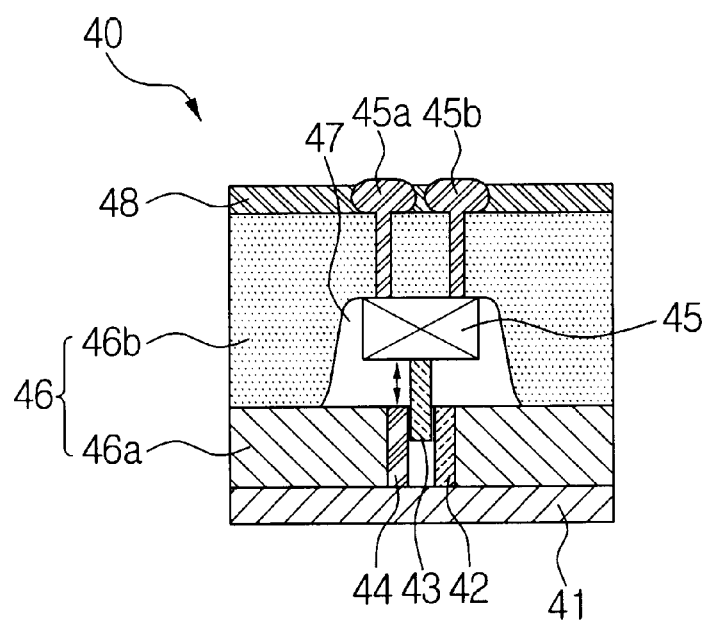
FIG. 4 is a cross-sectional view showing a variable capacitor according to a second embodiment of the present invention.

FIG. 4 is a cross-sectional view for showing a variable capacitor according to a second embodiment of the present invention.

Referring to FIG. 4, a variable capacitor 40 includes first and second electrodes 42 and 44 formed above a substrate 41 made of silicon and spaced apart from each other, and an actuator 45. A reference numeral 48 is an insulation layer.

The first and second electrodes 42 and 44 are formed of conductive materials above the silicon substrate 41 to be spaced by a predetermined distance from each other.

A support layer 46 is formed above the substrate 41 with an insulation material to form an interior space. The support layer 46 is constituted with a first support layer 46a supporting a portion of each of the second electrode 44 and the first electrode 42 and a second support layer 46b supporting an actuator 45. The respective first and second layers 46a and 46b may be formed of the same materials or different materials.

A dielectric substance 43, which may be of a ferroelectric material, is connected with the actuator 45 to move back and forth in a space 47 formed in the support layer 46 and between the first electrode 42 and the second electrode 44.

The actuator 45 is an element that varies the capacitance, and is mounted to be supported on the upper wall of the space 47 formed in the second support layer 46b, to thereby move the dielectric substance 43 up and down according to an electric signal input through driving electrodes 45a and 45b.

Preferably, the actuator 45 is formed of a piezoelectric material which is contracted and expanded according to an applied voltage. In this case, the actuator 45 is expanded according to a signal input through the driving electrodes 45a and 45b, and the dielectric substance 43 moves in association with the contraction and expansion of the actuator 45.

Terminals for the first and second electrodes 42 and 44, not shown, acting as external connections may be formed in diverse manners such as by forming the terminals to be exposed through the insulation layer 48 by extending them from the first electrode 42 and the second electrode 44, or by forming the terminals in a different manner to be fit for the integration of a circuit which is applied thereto, or the like.

Such a variable capacitor 40 varies its capacitance based on the changes of an effective dielectric constant between the first electrode 42 and the second electrode 44.

The variable capacitor 40 is manufactured by forming respective layers with corresponding materials through depositions and lithography processes based on the general semiconductor micro machining technologies. In case of being employed in an integrated device, the variable capacitor 40 is formed to be fit for a circuit which is applied thereto.

Hereinafter, a memory device according to the present invention to which the variable capacitor is applied will be described.

Figure 5:
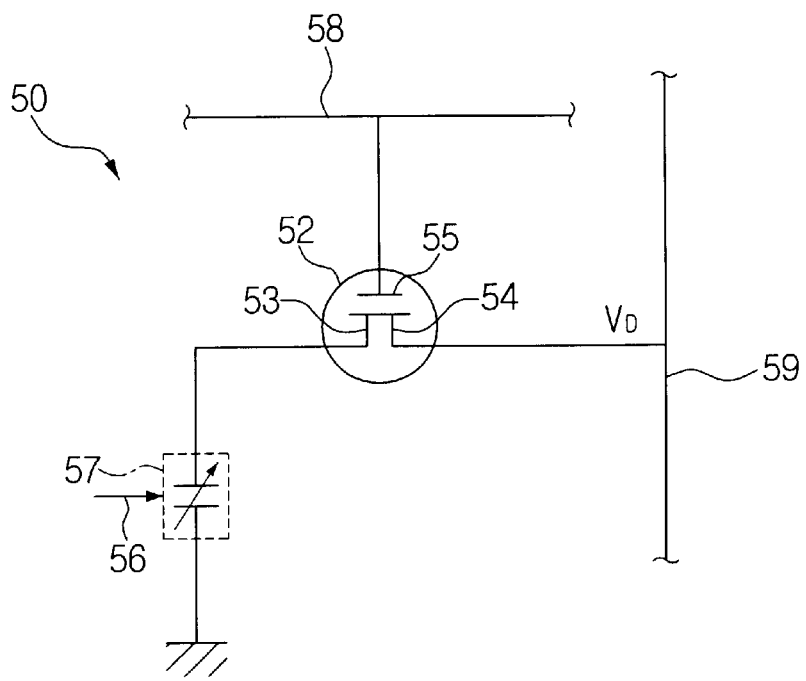
FIG. 5 is a view showing an equivalent circuit of the memory device according to the present invention.

FIG. 5 is a view for showing an equivalent circuit of a memory device according to the present invention.

Referring to FIG. 5, a memory device 50 includes a transistor 52 and a variable capacitor 57 connected to a source 53 of the transistor 52.

The transistor 52 has the source 53, a drain 54, and a gate 55.

The variable capacitor 57 is formed for its capacitance to be variable according to a signal input through a second control signal line 56, differently from the source 53.

The memory device 50 can store data of multiple values by varying the capacitance of the variable capacitor 57. That is, if a write signal is applied through the gate 55 connected to a first control line 58 of the memory device 50 and a signal varying the capacitance of the variable capacitor 57 is applied in order for the variable capacitor 57 to have a capacitance corresponding to any of multiple charging values storable by the variation of the capacitance through the second control line 56, a certain voltage is charged in correspondence with the varied capacitance to the capacitor 57 through the drain 54 connected to a data line 59. Here, the maintenance time period of the write signal applied through the gate 55 is determined to vary the charging voltage in response to a variable range of the capacitance of the variable capacitor 57, based on impedance of a transistor.

Further, upon reading a data value, a read signal is applied through the gate 55 connected to the first control line 58, and the data value is read from a voltage signal output in correspondence to a voltage charged to the variable capacitor 57 through the drain 54 connected to the data line 59. Here, the multiple value data indicates data writable through the discrimination of the data into multiple values by one variable capacitor 57. For example, in order to write decimal data in a unit cell of the memory device according to the present invention, the capacitance of the variable capacitor 57 is varied in 10 steps to distinctively produce in the 10 steps the voltage charged in the variable capacitor 57. For example, in case that a data value of 0 is obtained if a charged voltage of the variable capacitor 57 is less than 0.5 V, 1 if between more than 0.5 V and less than 1 V, 2 if between more than 1 V and less than 1.5 V, 3 if between 1.5 V and less than 2 V, 4 if between more than 2 V and less than 2.5 V, 5 if between more than 2.5 V and less than 3 V, 6 if between more than 3 V and less than 3.5 V, 7 if between more than 3.5 V and less than 4 V, 8 if between more than 4 V and less than 4.5 V, and 9 if more than 4.5 V, the capacitance of the variable capacitor 57 is varied in multiple steps to produce charging voltages corresponding to the respective data values.

Hereinafter, examples of the memory device to which the variable capacitors of FIG. 3 and FIG. 4 are applied will be described with reference to FIG. 6 and FIG. 7.

The components having the same functions as those in the preceding drawings are referred to by the same reference numerals.

Figure 6:
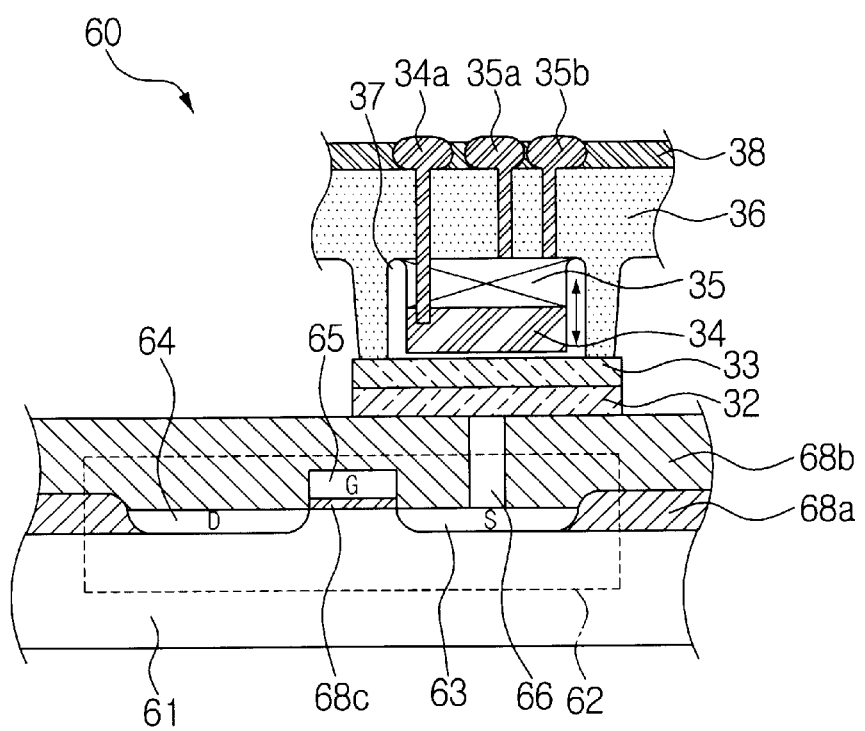
FIG. 6 is a cross-sectional view showing the memory device according to the first embodiment of the present invention.

FIG. 6 is a cross-sectional view for showing a memory device according to the first embodiment of the present invention.

Referring to FIG. 6, a memory device 60 has a transistor 62 formed above a substrate 61 and a variable capacitor connected to the transistor 62.

The transistor 62 includes a source (S) 63, a drain (D) 64, and a gate (G) 65, which are formed to be spaced apart from each other above the substrate 61.

Reference numerals 68a, 68b, and 68c indicate insulation layers, and 66 is a conductive connection layer electrically connecting the first electrode 32 and the source 63.

The variable capacitor can be formed to vary the capacitance by semiconductor elements.

The variable capacitor has the first electrode 32, the dielectric substance 33, in this case formed of a ferroelectric material, and the second electrode 34 mounted to be supported on the actuator 35 and movable with respect to the first electrode 32, which are sequentially formed on the insulation layer 68b.

The actuator 35 is mounted to be supported on the support layer 36 formed above the insulation layer 68b as an element for varying the capacitance.

The memory device 60 can store and reproduce multiple-value data by varying the capacitance through the variation of a space distance between the second electrode 34 and the first electrode 32 by the driving of the actuator 35 through the driving electrodes 35a and 35b.

As stated above, the actuator 35 is preferably formed of a piezoelectric material.

Figure 7:
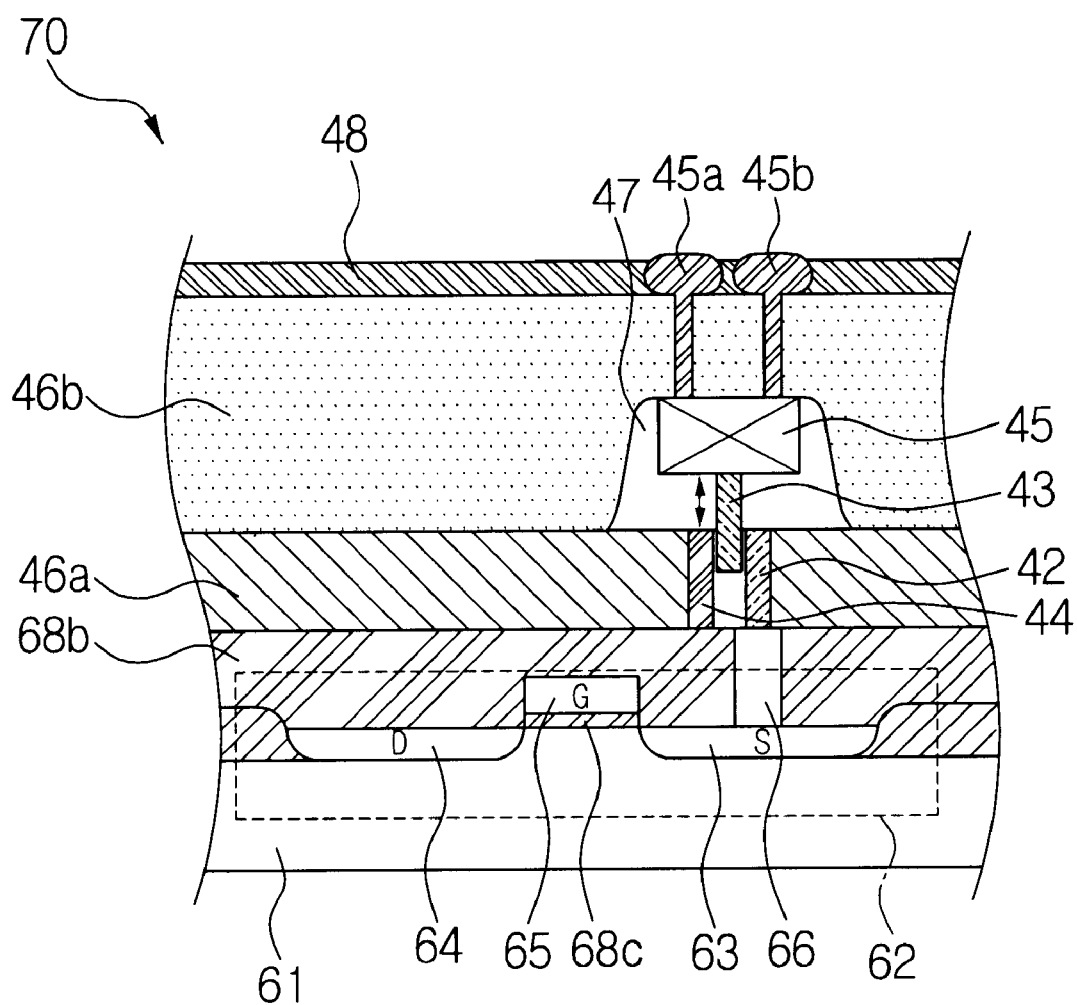
FIG. 7 is a cross-sectioned view showing the memory device according to the second embodiment of the present invention.

FIG. 7 is a cross-sectioned view showing the memory device according to the second embodiment of the present invention.

Referring to FIG. 7, a memory device 70 has a transistor 62 formed above the substrate 61 and a variable capacitor connected to the transistor 62.

The insulation layer 68b and the support layers 46a and 46b, separately described to skip repetitious descriptions of the functions explained earlier with reference to the accompanying drawings, may be formed of the same, or different material.

The variable capacitor includes the first electrode 42 formed above a conductive connection layer 66, the second electrode 44 formed to be spaced apart by a distance from the first electrode 42, and a dielectric substance 43, made from a ferroelectric material, connected to the actuator 45 to move back and forth in a space between the first electrode 42 and the second electrode 44.

The actuator 45 is mounted as an element varying the capacitance to be supported by the support layer 46 formed above the insulation layer 68b.

The memory device 70 can store and reproduce multiple-value data by varying the capacitance through the variation of an area of the the ferroelectric material 43 occupied in the space between the first and second electrodes 42 and 44 by the driving of the actuator 45 by way of the driving electrodes 45a and 45b.

As stated so far, with the variable capacitor and the memory device employing the same, the variable capacitor allows the correction of a capacitance error caused during manufacturing by varying the capacitance of the capacitor through electrical driving and provides compatibility with the specification of an electronic unit to which the capacitor is to be applied. The memory device can store multiple values more extensive than binary values in a memory cell, to increase the data storage density.

Although a few preferred embodiments of the present invention have been shown and described, it would be appreciated by those skilled in the art that changes may be made in these embodiments without departing from principles and spirit of invention, the scope of which is defined in the claims and their equivalents.

What is claimed is:

1. A variable capacitor, comprising:

a substrate;

a supporting layer and an insulating layer formed on the substrate;

a first electrode formed above the substrate;

a second electrode suspended with respect to the first electrode to be moved back and forth with respect to the first electrode and positioned between the substrate and the insulating layer;

a driving electrode exposed external to the variable capacitor; and a device to vary a capacitance, one end of which is connected to the second electrode, to move the second electrode relative to the first electrode in accordance with a voltage signal input through the driving electrode.

2. The variable capacitor as claimed in claim 1, wherein the device to vary the capacitance is formed of a piezoelectric material which is contracted and expanded in response to the voltage signal input through the driving electrode.

3. The variable capacitor as claimed in claim 2, further comprising a dielectric substance formed between the first electrode and the second electrode.

4. The variable capacitor as claimed in claim 3, wherein the dielectric substance is connected to the first electrode.

5. The variable capacitor as claimed in claim 4, wherein the dielectric substance is formed of a ferroelectric material.

* * * * *